United States Patent [19]
Yu et al.

[11] Patent Number: 5,985,753
[45] Date of Patent: Nov. 16, 1999

[54] METHOD TO MANUFACTURE DUAL DAMASCENE USING A PHANTOM IMPLANT MASK

[75] Inventors: Allen S. Yu, Fremont; Paul J. Steffan, Elk Grove; Thomas C. Scholer, San Jose, all of Calif.

[73] Assignee: Advanced Micro Devices, Inc., Sunnyvale, Calif.

[21] Appl. No.: 09/136,866

[22] Filed: Aug. 19, 1998

[51] Int. Cl.⁶ .................................................. H01L 21/4763
[52] U.S. Cl. .......................... 438/637; 438/622; 438/700; 438/634
[58] Field of Search ................................... 438/622, 637, 438/638, 634, 740, 734, 700

[56] References Cited

U.S. PATENT DOCUMENTS

| | | | |
|---|---|---|---|
| 4,789,648 | 12/1988 | Chow et al. | 438/633 |
| 5,354,711 | 10/1994 | Heiztmann et al. | 438/638 |
| 5,578,523 | 11/1996 | Fiordalice et al. | 438/633 |
| 5,783,485 | 7/1998 | Ong et al. | 438/637 |
| 5,858,877 | 1/1999 | Dennison et al. | 438/700 |
| 5,869,395 | 2/1999 | Yim | 438/637 |
| 5,882,996 | 3/1999 | Dai | 438/597 |
| 5,897,369 | 4/1999 | Jun | 438/629 |

*Primary Examiner*—Tuan H. Nguyen
*Attorney, Agent, or Firm*—H. Donald Nelson

[57] ABSTRACT

Methods of manufacturing semiconductor devices wherein a selected layer is implanted with heavy ions in a pattern having dimensions of a via structure to be formed in a first layer of interlayer dielectric. In a first embodiment, the ions are implanted in an etch stop layer formed between a first and second layer of interlayer dielectric. In a second embodiment, the ions are implanted in the second layer of interlayer dielectric. Selective etch processes form a trench structure in the second layer of interlayer dielectric and form a via structure in the first layer of interlayer dielectric. The via structure and trench structure are filled with a conductive material.

10 Claims, 9 Drawing Sheets

METHOD TO MANUFACTURE DUAL DAMASCENE USING A PHANTOM IMPLANT MASK

BACKGROUND OF THE INVENTION

1. Field of the Invention

This invention relates generally to a method of manufacturing high density, high performance semiconductor devices that have dual damascene interconnects. More specifically, this invention relates to a method of manufacturing high density, high performance semiconductor devices that have dual damascene interconnects using a phantom implant mask.

2. Discussion of the Related Art

The increased demand for higher performance semiconductor devices has required more complex process technologies and materials to be utilized in the manufacture of semiconductor integrated devices. One way to increase the performance of a semiconductor integrated device such as a microprocessor is to reduce the gate width of the field effect transistors in the device in order to achieve high internal clock speed for the microprocessor. The reduced gate widths have increased the performance significantly, however, the interconnect structure of the microprocessor has proved to be a roadblock to further increase in performance. This is because as increased performance is required, more transistors need to be manufactured in the semiconductor integrated device. These added transistors require more wiring in the interconnect structure. The increased density of the wiring can result in a decrease in performance relating to RC delays. To counteract the degradation in performance due to the RC delays, additional layers in which interconnects are formed are manufactured in order to separate the wiring in both the vertical and horizontal directions. These requirements have necessitated the development of novel approaches in the methods of forming interconnections that not only integrate fine geometry definition but also can be efficiently implemented into the manufacturing process.

One method if forming a trench is a method known as the damascene process, which comprises forming a trench by masking and etching techniques and subsequent filling of the trench with the desired conductive material. The damascene process is a useful method for attaining the fine geometry metallization required for advanced semiconductor devices. A dual damascene process is a two step sequential mask/etch process to form a two level structure such as a via connected to a metal line above the via.

Current dual damascene processing technology entails depositing a triple layer sandwich consisting of a thick layer of a dielectric material, an etch stop material having a high etch selectivity to the dielectric layer, and a second thick layer of a dielectric material. The two level structure is formed by masking and etching through the top layer of dielectric material stopping on the layer of etch stop material, etching the etch stop material only, then performing a second masking and etching process with the second masking being an oversize masking. The second etch process is to the dielectric material underlying the lower layer of dielectric material.

A problem with the current damascene process is the number of defects associated with the metal etch back process associated with damascene processing. The problem is the residual metal particles that may be left after the metal etch back that can short out the circuit. A single damascene process is used to etch trenches in an insulating dielectric material. A conductive material is deposited into these trenches and the excess polished using a chemical mechanical process. This method shows dramatic reduction of defects, however, this method is time consuming.

Therefore, what is needed is a method of forming the via structure and the trench structure together.

SUMMARY OF THE INVENTION

According to the present invention, the foregoing and other objects and advantages are obtained by method of manufacturing semiconductor devices wherein a selected layer is implanted with heavy ions in a pattern having dimensions of a via structure to be formed in a first layer of interlayer dielectric in the semiconductor device. In accordance with one aspect of the invention, the method involves implanting ions into a region of an etch stop layer, the region having dimensions of a via structure to be formed in the first layer of interlayer dielectric, wherein the etch stop layer is formed between a first and second layer of interlayer dielectric. The second layer of interlayer dielectric is etched with a pattern having dimensions of a trench structure to be formed in the second layer of interlayer dielectric. The trench structure and via structure are etched and filled with a conductive material to form the trench and via structure. The etch stop layer is formed from a material selected from $SiON$, $Si_3N_4$ or other nitride material. The conductive material is selected from a material selected from tungsten, aluminum and copper.

In another aspect of the invention, the method involves implanting ions into a region of a second layer of interlayer dielectric, the region having dimensions of a via structure to be formed in a first layer of interlayer dielectric. The second layer of interlayer dielectric is etched with a pattern having dimensions of a trench structure to be formed in the second layer of interlayer dielectric. The trench structure and via structure are etched and filled with a conductive material to form the trench and via structure. The etch stop layer is formed with a material selected from $SiON$, $Si_3N_4$ or other nitride material. The conductive material is selected from a material selected from tungsten, aluminum and copper.

The described methods thus provide methods of manufacturing semiconductor devices wherein trench and via structures are formed together.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1A:
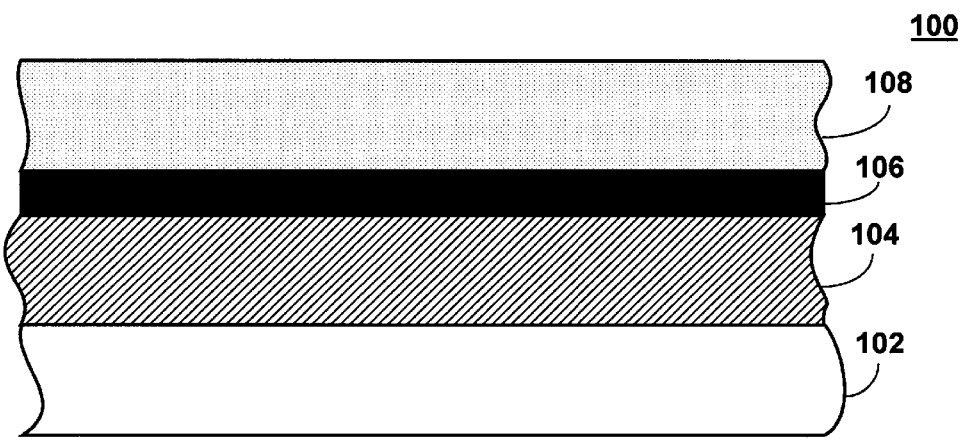
FIG. 1A shows a first embodiment of a partially completed semiconductor device showing a first layer of interlayer dielectric formed on a semiconductor substrate in which active devices have been formed, an etch stop layer formed on the first layer of interlayer dielectric and a layer of photoresist formed on the etch stop layer.

FIGS. 1A–1M show a first embodiment of a method to form dual damascene interconnects in accordance with the present invention. FIG. 1A shows a partially completed semiconductor device 100. The partially completed semiconductor device 100 is formed in a semiconductor substrate on and in which active devices (not shown) are formed. The substrate and active devices are indicated generally at 102 and will not be discussed further since the methods of forming active devices in and on a semiconductor substrate are well known in the semiconductor manufacturing art and such methods of formation are not a part of the present invention. The surface of the substrate 102 is planarized and serves as a uniform flat surface on which to form further structures on the surface of the semiconductor substrate 102. A first layer of interlayer dielectric 104 is formed on the planarized surface of the semiconductor substrate 102. The first layer of interlayer dielectric 104 is typically formed from a low dielectric constant material such as silicon dioxide ($SiO_2$). The top surface of the interlayer dielectric 104 is planarized to serve as a flat surface for the formation of further layers. A boundary layer or etch stop layer 106 is formed on the surface of the interlayer dielectric 104. The etch stop layer 106 is typically formed of a nitride material such as silicon oxynitride (SiON) or silicon nitride ($Si_3N_4$). The purpose of the etch stop layer 106 is to stop a subsequent etch process from etching into the first interlayer dielectric 104. A layer of photoresist 108 is formed on the etch stop layer 106.

Figure 1B:
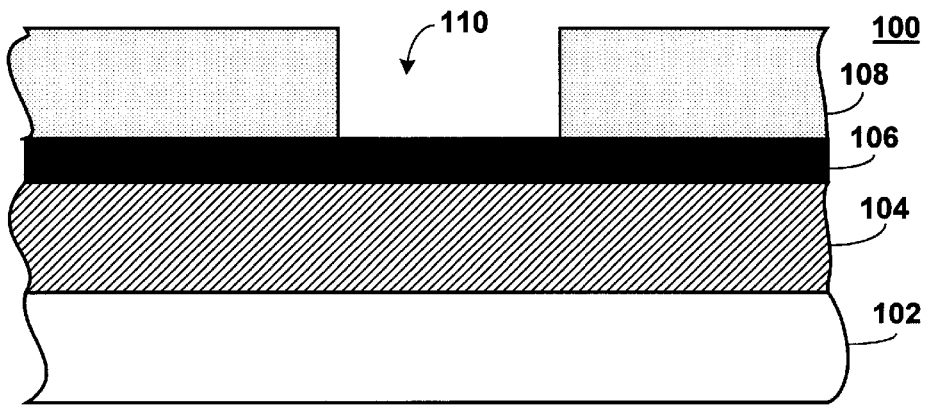
FIG. 1B shows the partially completed semiconductor device shown in FIG. 1A with the layer of photoresist patterned and etched.

FIG. 1B shows the partially completed semiconductor device 100 as shown in FIG. 1A with the layer of photoresist 108 patterned and etched. All etch processes discussed are anisotropic etch processes, that is, etch processes that are directional as opposed to isotropic etch processes that etch in all directions. The dimensions of the etched portion 110 are the dimensions of the vias that will be formed in the first layer of interlayer dielectric 104.

Figure 1C:
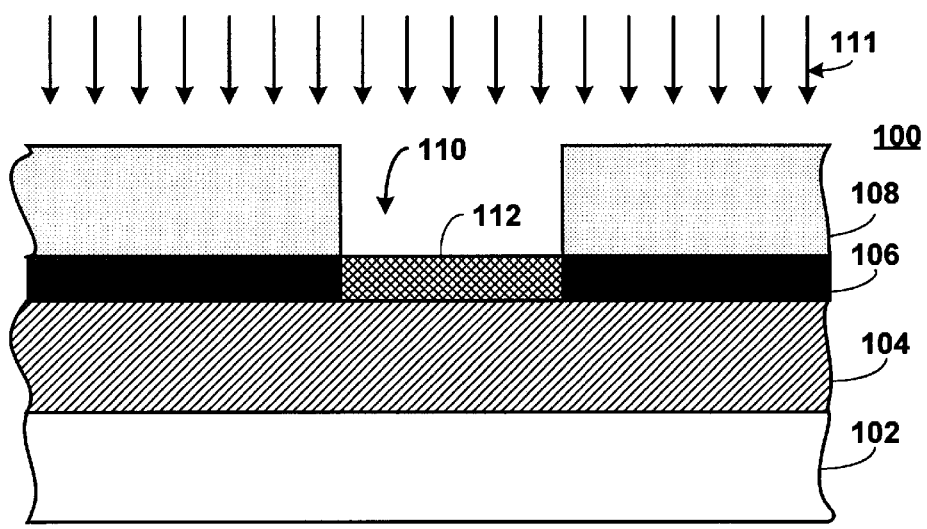
FIG. 1C shows the partially completed semiconductor device shown in FIG. 1B showing the structure being implanted with ions to form a doped etch stop region.

FIG. 1C shows the partially completed semiconductor device 100 as shown in FIG. 1B being implanted with ions, as indicated at 111, to form a heavily doped region 112 in the etch stop layer 106. The implanted ions are selected to be heavy molecules such as arsenic ions or phosphorus ions. The purpose of the implantation is to create a region in the etch stop layer that is less impervious to etching than the surrounding etch stop layer 106.

Figure 1D:
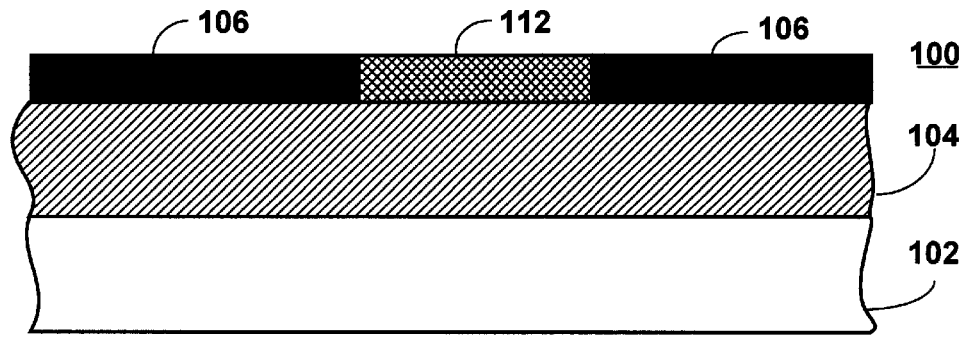
FIG. 1D shows the partially completed semiconductor device shown in FIG. 1C with the remaining photoresist layer removed.

FIG. 1D shows the partially completed semiconductor device 100 as shown in FIG. 1C with the remaining layer of photoresist 108 removed.

Figure 1E:
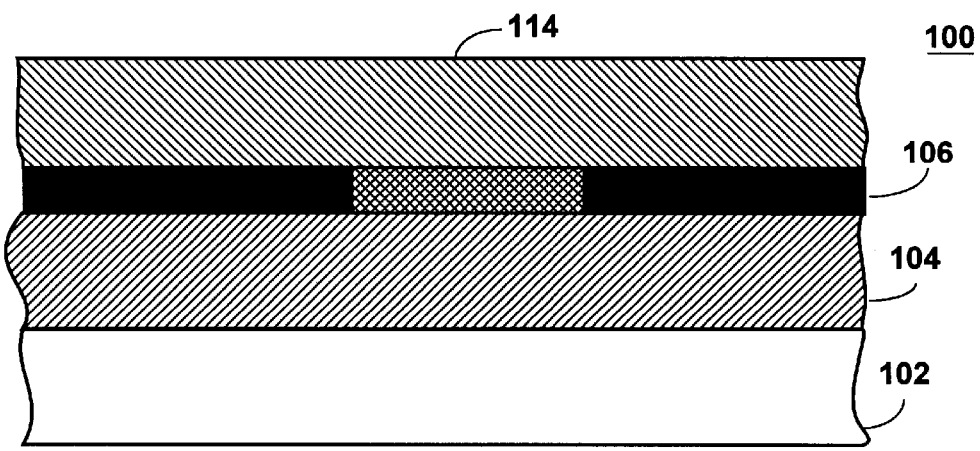
FIG. 1E shows the partially completed semiconductor device shown in FIG. 1D with a second layer of interlayer dielectric formed on the structure.

FIG. 1E shows the partially completed semiconductor device 100 as shown in FIG. 1D with a second layer of interlayer dielectric 114 formed on the surface of the etch stop layer 106. The second layer of interlayer dielectric 114 is typically formed from a low dielectric constant material such as silicon dioxide (SiO$_2$).

Figure 1F:
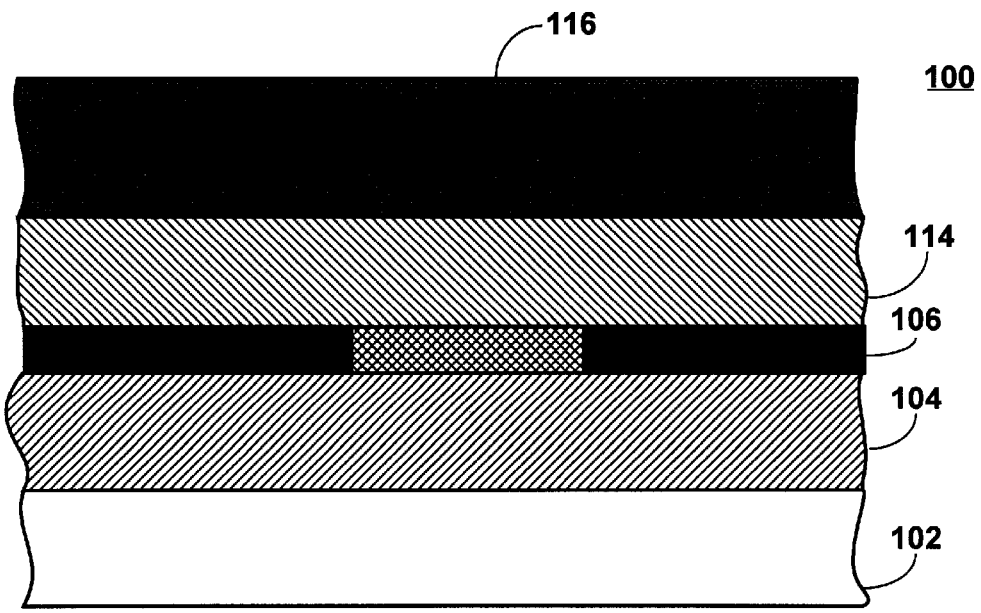
FIG. 1F shows the partially completed semiconductor device shown in FIG. 1E with a layer of photoresist formed on the second layer of interlayer dielectric.

FIG. 1F shows the partially completed semiconductor device 100 as shown in FIG. 1E with a second layer of photoresist 116 formed on the surface of the second layer of interlayer dielectric 114.

Figure 1G:
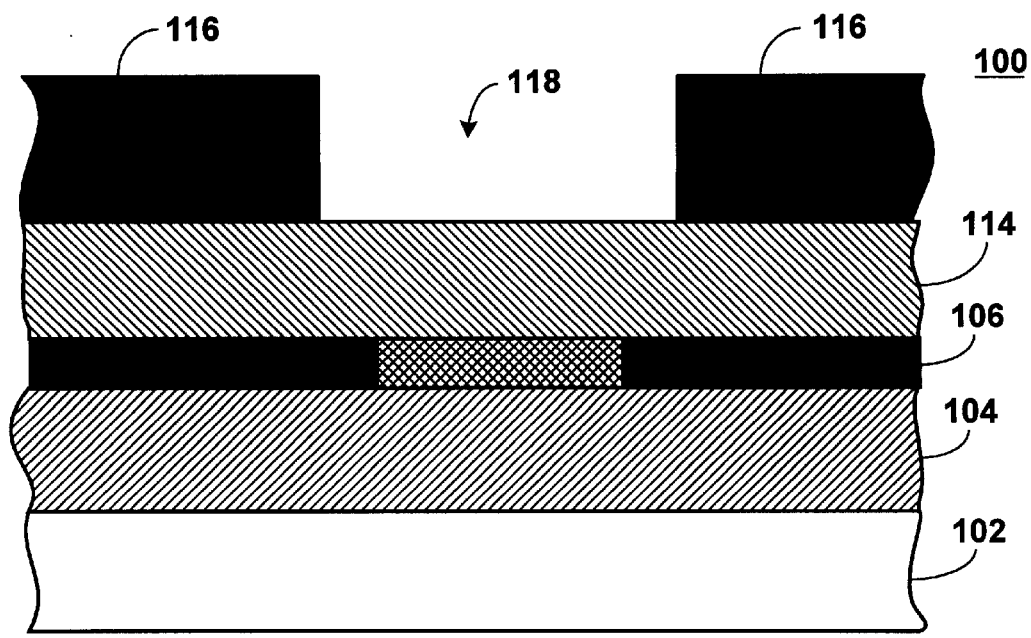
FIG. 1G shows the partially completed semiconductor device shown in FIG. 1F with the layer of photoresist patterned and etched.

FIG. 1G shows the partially completed semiconductor device 100 as shown in FIG. 1F with the second layer of photoresist 116 patterned and etched. The dimensions of the etched portion 118 are the dimensions of the trenches that will be formed in the second layer of interlayer dielectric 114.

Figure 1H:
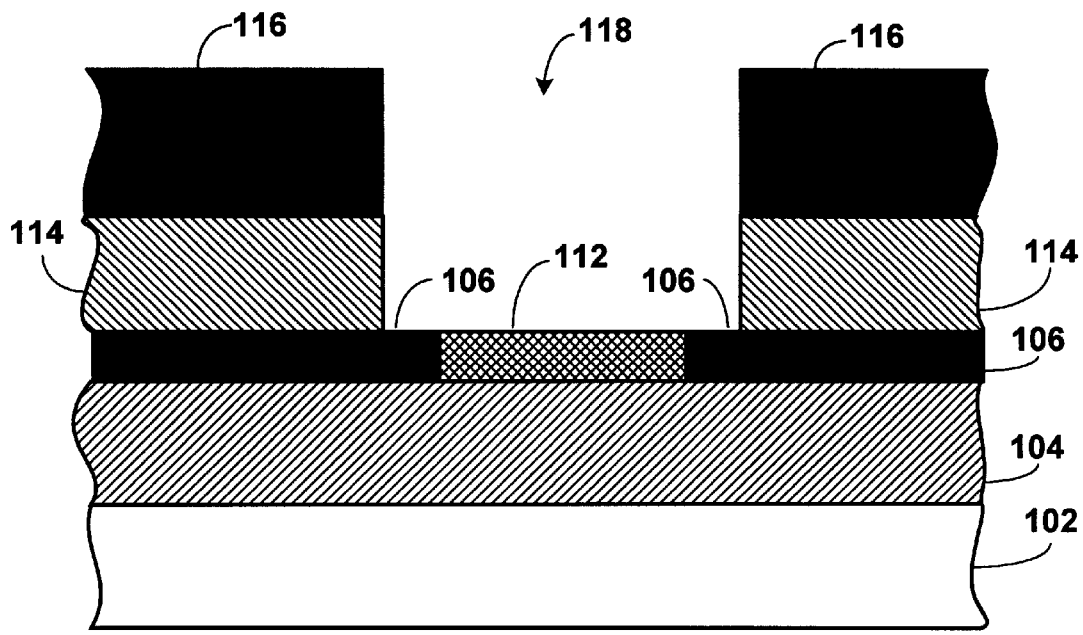
FIG. 1H shows the partially completed semiconductor device shown in FIG. 1G after a first etch process to etch the second layer of interlayer dielectric down to the etch stop layer forming a trench structure.

FIG. 1H shows the partially completed semiconductor device 100 as shown in FIG. 1G with the second layer of interlayer dielectric 114 etched down to the surface of the etch stop layer 106.

Figure 1I:
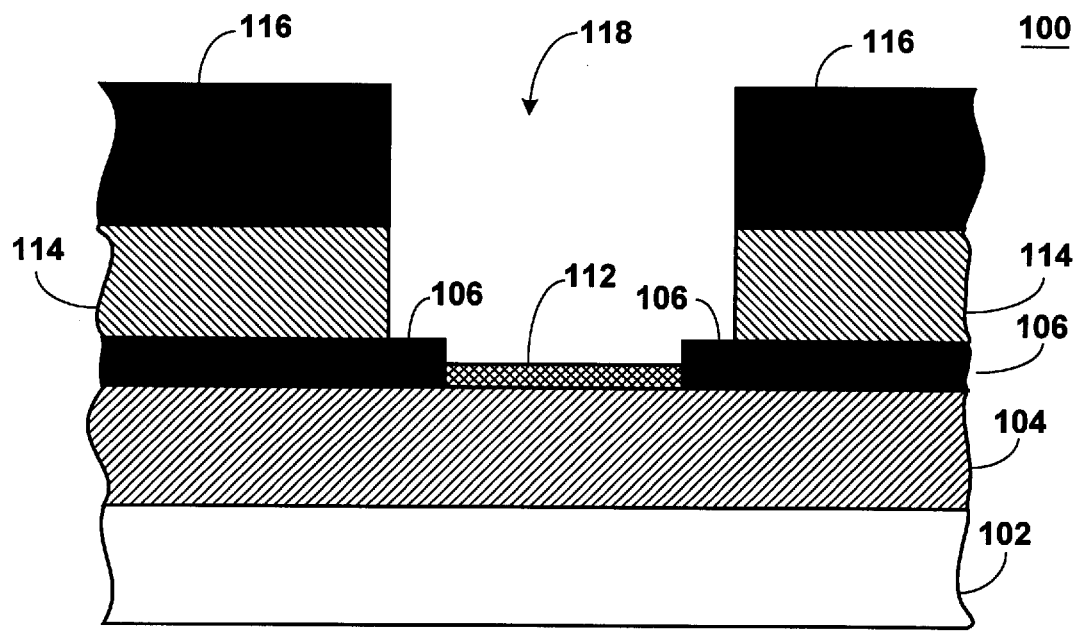
FIG. 1I shows the partially completed semiconductor device shown in FIG. 1H showing the doped etch stop region partially removed.

FIG. 1I shows the partially completed semiconductor device 100 as shown in FIG. 1H with a portion of the heavily doped region 112 partially etched. The heavy doping of the etch stop layer 106 makes the doped region more susceptible to the etch process.

Figure 1J:
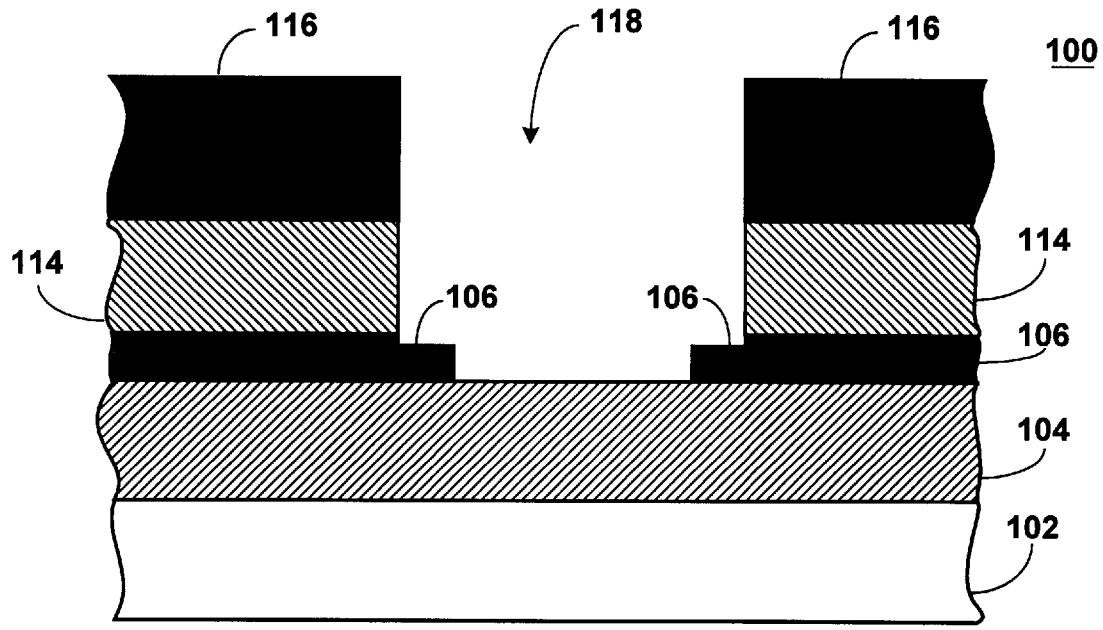
FIG. 1J shows the partially completed semiconductor device shown in FIG. 1I showing the structure after an etch process to remove the doped etch stop region.

FIG. 1J shows the partially completed semiconductor device 100 as shown in FIG. 1I after an etch process to remove the remainder of the heavily doped region 112 in the etch stop layer 106.

Figure 1K:
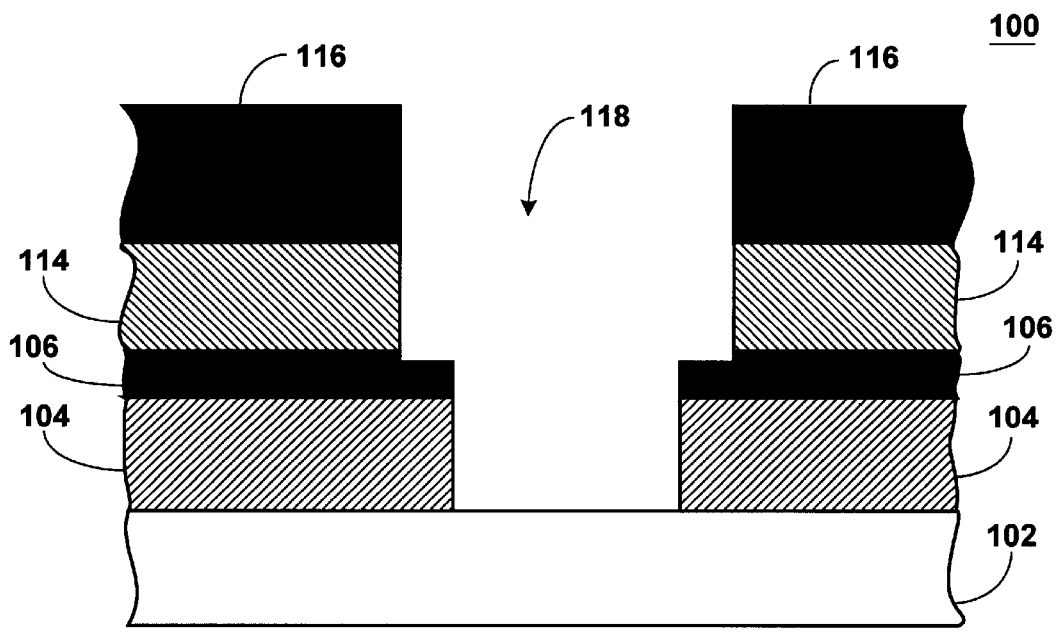
FIG. 1K shows the partially completed semiconductor device after an etch process to etch the first dielectric layer down to the semiconductor substrate forming a via structure.

FIG. 1K shows the partially completed semiconductor device 100 as shown in FIG. 1J after an etch process to etch the first layer of interlayer dielectric 104. The first layer of interlayer dielectric 104 is etched down to the surface of the semiconductor substrate 102.

Figure 1L:
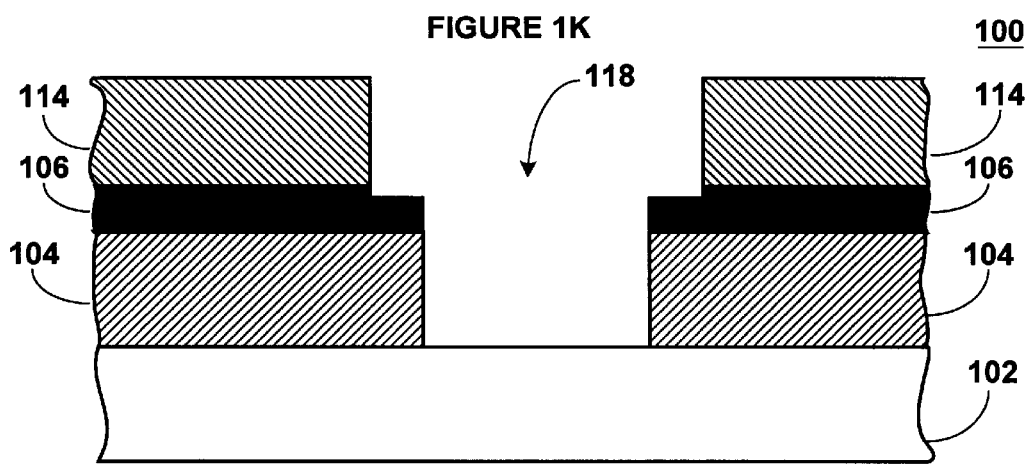
FIG. 1L shows the partially completed semiconductor device shown in FIG. 1K with the remaining layer of photoresist removed.
Figure 1M:
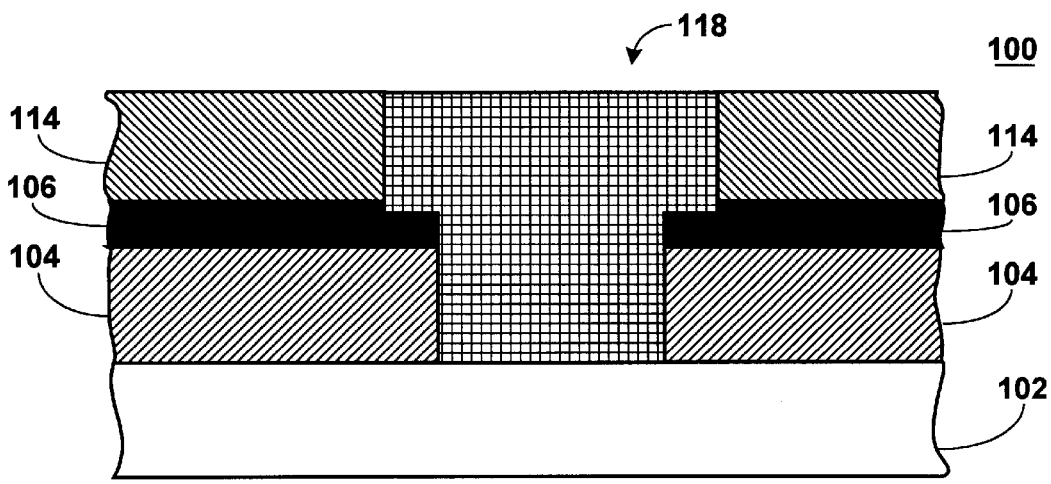
FIG. 1M shows the partially completed semiconductor device shown in FIG. 1L with the trench structure and via structure filled with a conductive material.

FIG. 1L shows the partially completed semiconductor device 100 as shown in FIG. 1K with the remaining portions of the layer of photoresist 116 removed.

FIG. IM shows the partially completed semiconductor device 100 as shown in FIG. 1L with the etched portion 118 filled with a conductive material such as tungsten, aluminum or copper. As is known in the semiconductor manufacturing art, a barrier layer ail can be formed on the walls of the etched structure 118. The barrier layer can be formed from one of several materials including TiN (titanium nitride), TaN (tantalum nitride) or W$_2$N (tungsten nitride).

Figure 2A:
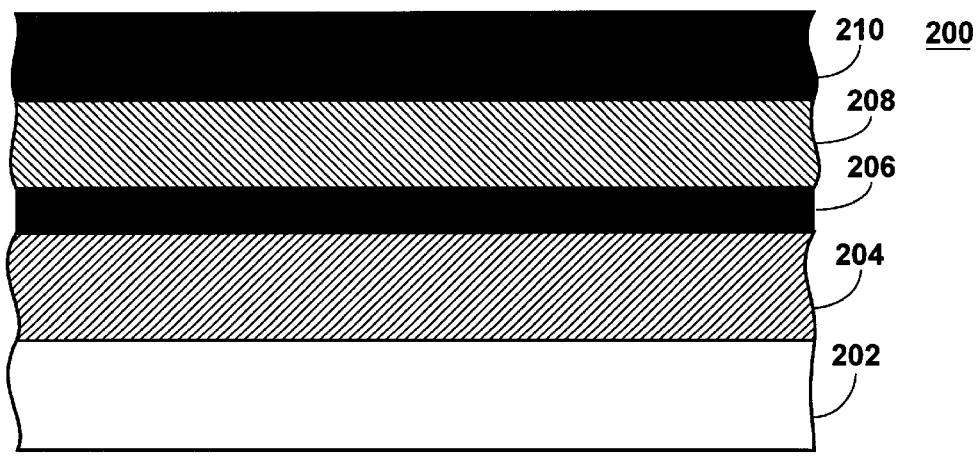
FIG. 2A shows a second embodiment of a partially completed semiconductor device showing a first layer of interlayer dielectric formed on a semiconductor substrate in which active devices have been formed, an etch stop layer formed on the first layer of interlayer dielectric, a second layer of interlayer dielectric formed on the etch stop layer and a layer of photoresist formed on the etch stop layer.

FIGS. 2A–2K show a second embodiment of a method to form dual damascene interconnects in accordance with the present invention. FIG. 2A shows a partially completed semiconductor device 200. The partially completed semiconductor device 200 is formed in a semiconductor substrate on and in which active devices (not shown) are formed. The substrate and active devices are indicated generally at 202 and will not be discussed further since the methods of forming active devices in and on a semiconductor substrate are well known in the semiconductor manufacturing art and such methods of formation are not a part of the present invention. The surface of the substrate 202 is planarized and serves as a uniform flat surface on which to form further structures on the surface of the semiconductor substrate 202. A first layer of interlayer dielectric 204 is formed on the planarized surface of the semiconductor substrate 202. The first layer of interlayer dielectric 204 is typically formed from a low dielectric constant material such as silicon dioxide (SiO$_2$). The top surface of interlayer dielectric 204 is planarized to serve as a flat surface for the formation of further layers. A boundary layer or etch stop layer 206 is formed on the surface of the interlayer dielectric 204. The etch stop layer 206 is typically formed of a nitride material such as silicon oxynitride (SiON) or silicon nitride (Si$_3$N$_4$). The purpose of the etch stop layer 206 is to stop a subsequent etch process from etching into the first layer of interlayer dielectric 204. A second layer of interlayer dielectric 208 is formed on the surface of the etch stop layer 206. The second layer of interlayer dielectric is typically formed from a low dielectric constant material such as silicon dioxide (SiO$_2$). A layer of photoresist 210 is formed on the surface of the second layer of interlayer dielectric 208.

Figure 2B:
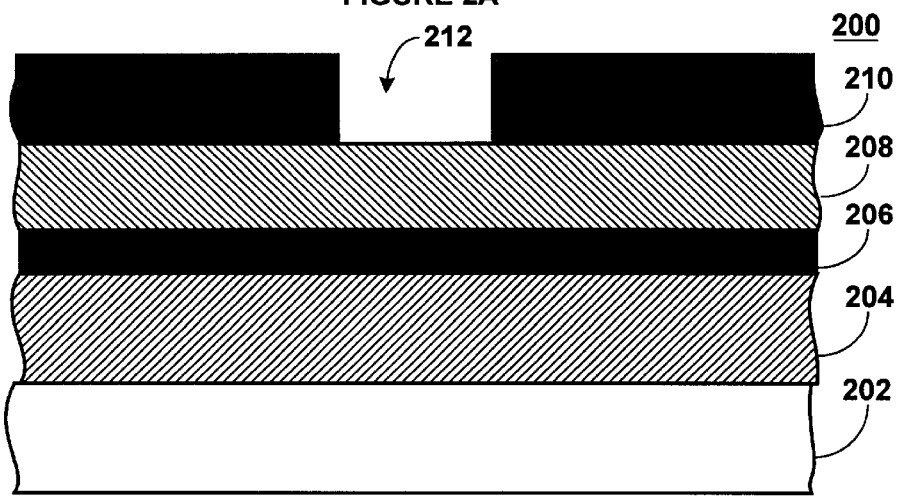
FIG. 2B shows the partially completed semiconductor device shown in FIG. 2A with the layer of photoresist patterned and etched.

FIG. 2B shows the partially completed semiconductor device 200 as shown in FIG. 2A with the layer of photoresist 210 patterned and etched. The dimensions of the etched portion 212 are the dimensions of the vias that will be formed in the first layer of interlayer dielectric 204.

Figure 2C:
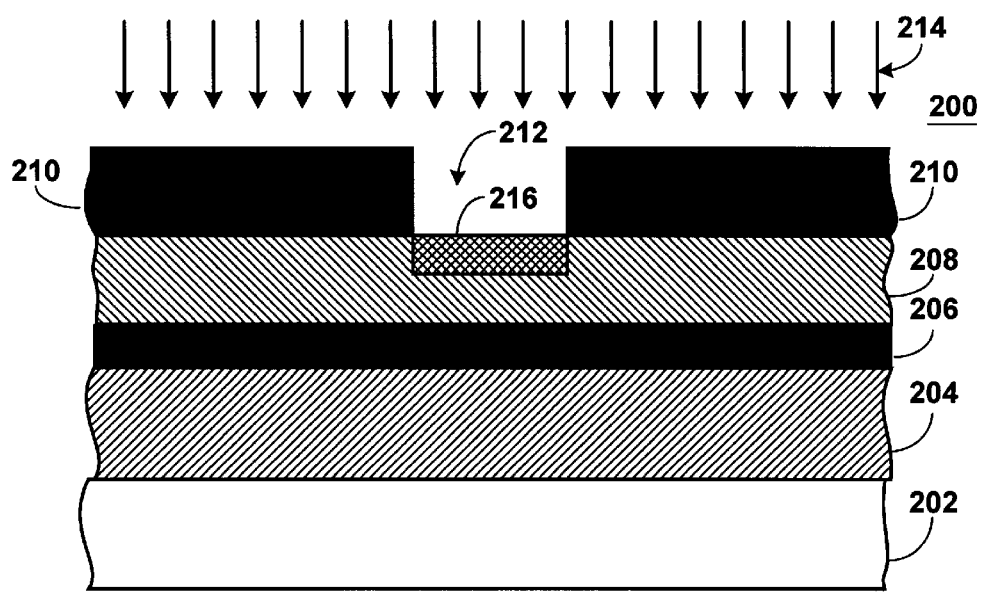
FIG. 2C shows the partially completed semiconductor device shown in FIG. 2B showing the structure being implanted with ions to form a doped region in the second layer of interlayer dielectric.

FIG. 2C shows the partially completed semiconductor device 200 as shown in FIG. 2B being implanted with ions, as indicated at 214, to form a heavily doped region 216 in the second layer of interlayer dielectric 208. The implanted ions are selected to be heavy molecules such as arsenic ions or phosphorous ions. The purpose of the implantation is to create a region in the second layer of interlayer dielectric 208 that is less impervious to etching than the surrounding dielectric material.

Figure 2D:
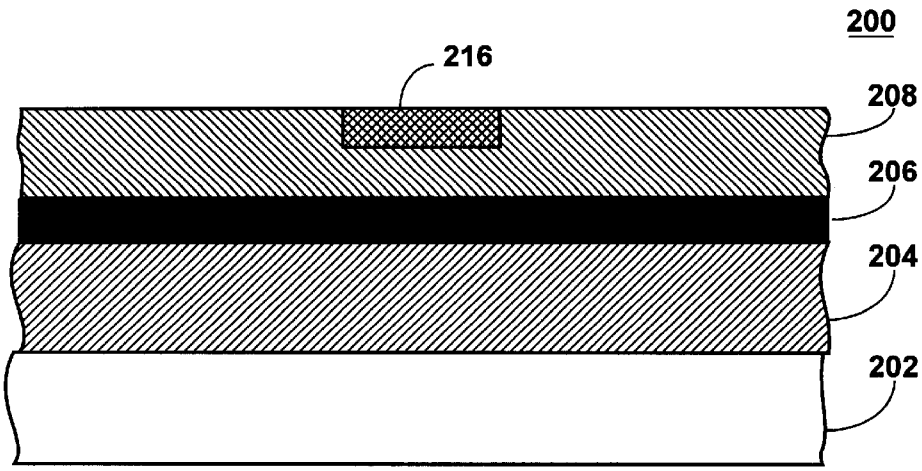
FIG. 2D shows the partially completed semiconductor device shown in FIG. 2C with the remaining layer of photoresist removed.

FIG. 2D shows the partially completed semiconductor device 200 as shown in FIG. 2C with the remaining layer of photoresist 210 removed.

Figure 2E:
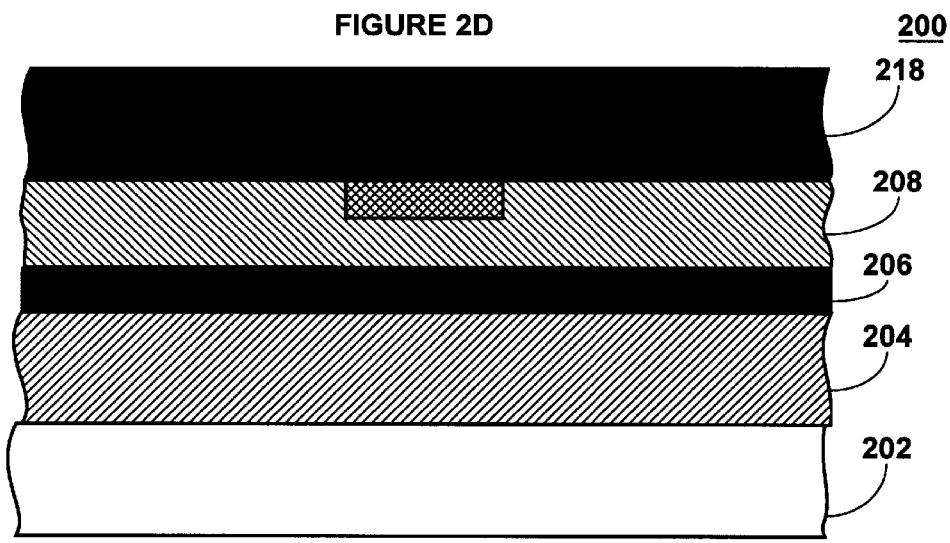
FIG. 2E shows the partially completed semiconductor device shown in FIG. 2D with a second layer of photoresist formed on the structure.

FIG. 2E shows the partially completed semiconductor device 200 as shown in FIG. 2D with a second layer of photoresist 218 formed on the surface of second layer of interlayer dielectric 208.

Figure 2F:
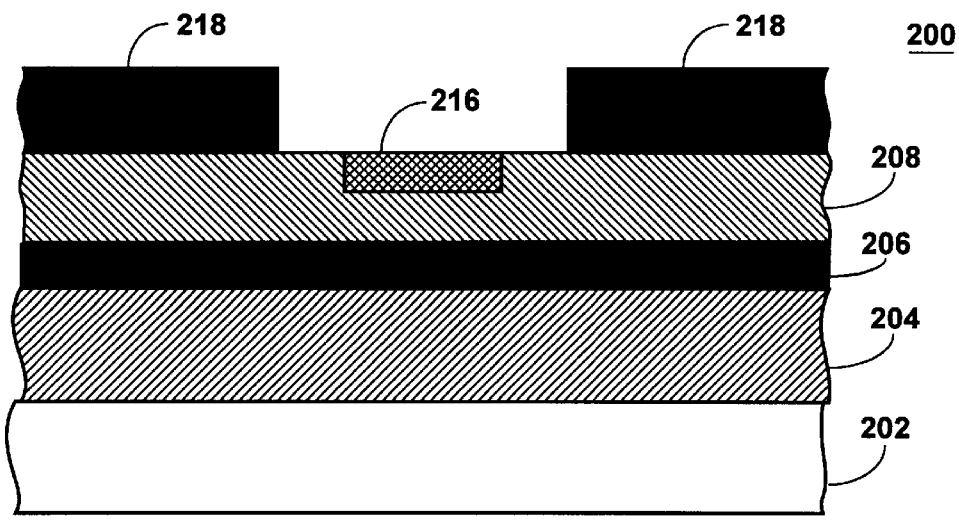
FIG. 2F shows the partially completed semiconductor device shown in FIG. 2E with the second layer of photoresist patterned and etched.

FIG. 2F shows the partially completed semiconductor device 200 as shown in FIG. 2E with the second layer of photoresist 218 patterned and etched. The dimensions of the etched portion 220 are the dimensions of the trenches that will be formed in the second layer of interlayer dielectric 208.

Figure 2G:
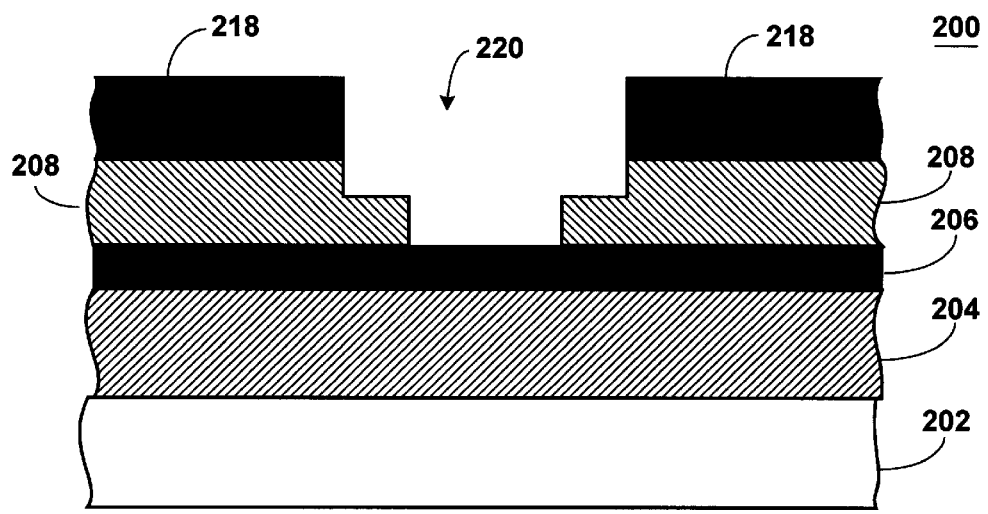
FIG. 2G shows the partially completed semiconductor device shown in FIG. 2F after an etch process to etch the second layer of interlayer dielectric.

FIG. 2G shows the partially completed semiconductor device 200 as shown in FIG. 2F after an etch process to etch the exposed portions of the second layer of interlayer dielectric 208 down to the etch stop layer 206. The etch process to etch the second layer of interlayer dielectric 208 exposes a portion of the etch stop layer 206.

Figure 2H:
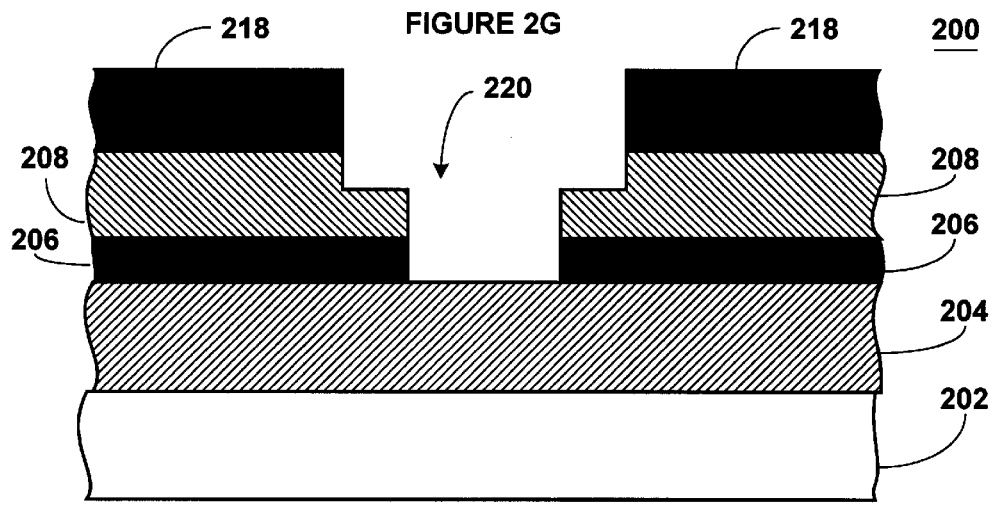
FIG. 2H shows the partially completed semiconductor device shown in FIG. 2G after an etch process to etch the etch stop layer.

FIG. 2H shows the partially completed semiconductor device 200 as shown in FIG. 2G after a selective etch process to remove the exposed portion of the etch stop layer 206. The etch process removes the etch stop layer 206 down to the first layer of interlayer dielectric 204. The etch process to etch the etch stop layer 206 exposes a portion of the first layer of interlayer dielectric 204.

Figure 2I:
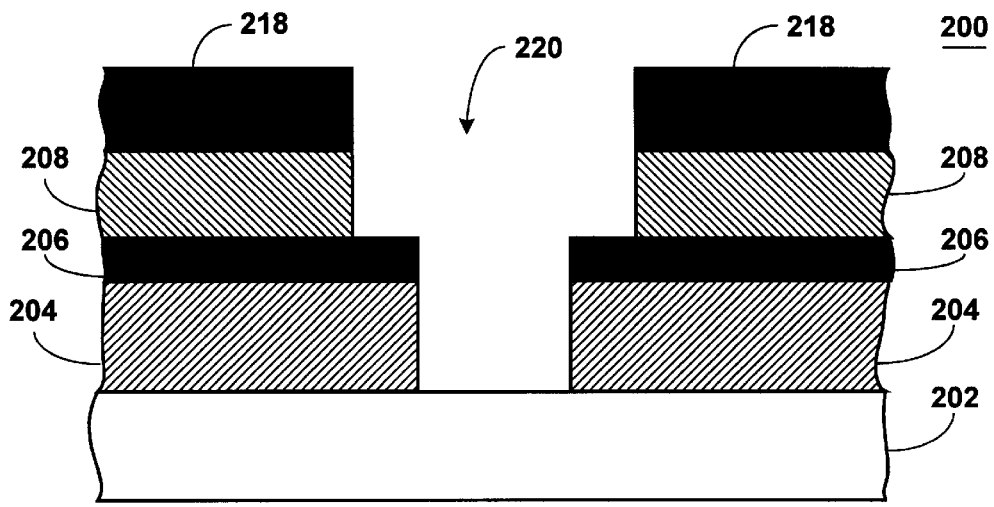
FIG. 2I shows the partially completed semiconductor device shown in FIG. 2H after an etch process to etch the second layer of interlayer dielectric down to the etch stop layer and to etch the first interlayer dielectric down to the semiconductor substrate, forming a trench structure and a via structure.

FIG. 2I shows the partially completed semiconductor device 200 as shown in FIG. 2H after a selective etch process to etch the exposed portion of the first layer of interlayer dielectric 204. The etch process to etch the first layer of interlayer dielectric 204 removes the first layer of interlayer dielectric 204 down to the surface of the semiconductor substrate 202.

Figure 2J:
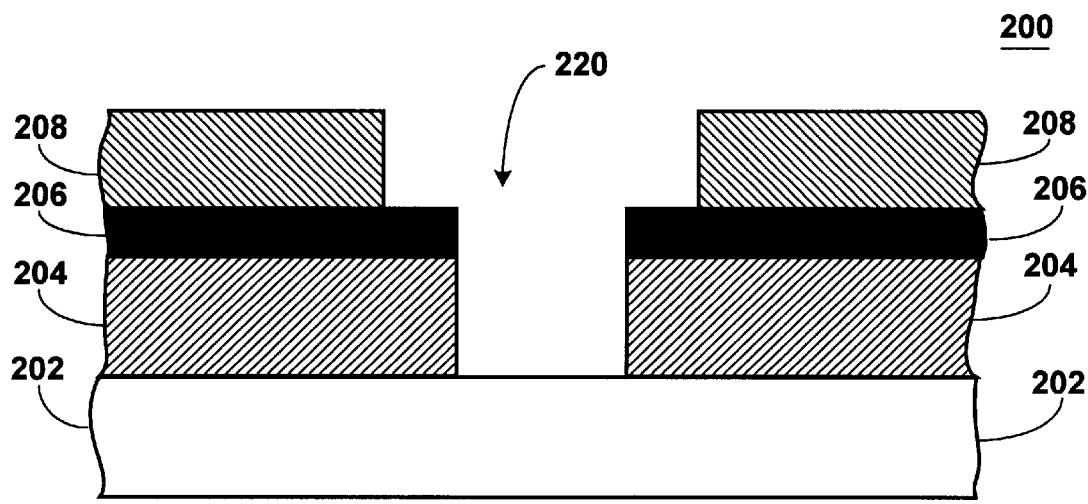
FIG. 2J shows the partially completed semiconductor device shown in FIG. 2K with the etched portions filled with a conductive material.

FIG. 2J shows the partially completed semiconductor device 200 as shown in FIG. 2I with the remaining portion of the second layer of photoresist 218 removed.

Figure 2K:
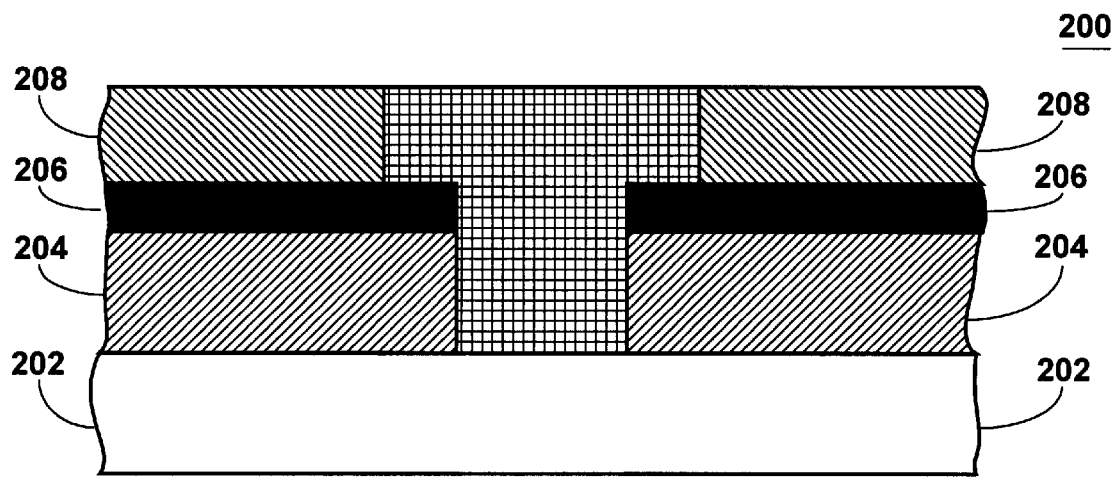

FIG. 2K shows the partially completed semiconductor device 200 as shown in FIG. 2J with the etched portion 220 filled with a conductive material such as tungsten, aluminum or copper. As is known in the semiconductor manufacturing art, a barrier layer can be formed on the walls of the etched structure 118. The barrier layer can be formed from one of several materials including TiN (titanium nitride), TaN (tantalum nitride) or $W_2N$ (tungsten nitride).

In summary, the results and advantages of the methods of the present invention can now be fully realized. The method of implanting a region of a selected layer with ions in a pattern of a via structure to be formed in a first layer of interlayer dielectric and etching a second layer of interlayer dielectric in a pattern of a trench structure to be formed in the second layer of interlayer dielectric allows the trench structure and the via structure to be formed together.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, the method comprising:

forming a first layer of interlayer dielectric on a surface of a semiconductor substrate that contains active semiconductor devices;

forming an etch stop layer on a surface of the first layer of interlayer dielectric;

forming a first layer of photoresist on a surface of the etch stop layer;

etching the first layer of photoresist down to the surface of the etch stop layer with an etch pattern having dimensions of a via structure to be formed in the first layer of interlayer dielectric, wherein a portion of the surface of the etch stop layer is exposed;

implanting ions in the exposed portion of the surface of the etch stop layer forming a heavily doped region in the etch stop layer having dimensions of the via structure to be formed in the first layer of interlayer dielectric;

removing the first layer of photoresist and forming a second layer of interlayer dielectric on the surface of the etch stop layer;

forming a second layer of photoresist on a surface of the second layer of interlayer dielectric;

etching the second layer of photoresist down to the surface of the second layer of interlayer dielectric with an etch pattern having dimensions of a trench structure to be formed in the second layer of interlayer dielectric;

selectively etching the second layer of interlayer dielectric down to the surface of the etch stop layer, wherein a trench structure is formed in the second layer of interlayer dielectric;

selectively etching the etch stop layer down to the surface of the first layer of interlayer dielectric; and selectively etching the first layer of interlayer dielectric down to the surface of the semiconductor substrate, wherein the via structure is formed in the first layer of interlayer dielectric.

2. The method of claim 1 further comprising filling the via structure formed in the first layer of interlayer dielectric and the trench structure formed in the second layer of interlayer dielectric with a conductive material.

3. The method of claim 2 wherein the conductive material is selected from the group consisting of aluminum, tungsten and copper.

4. The method of claim 3 wherein the etch stop layer is formed from a material selected from the group consisting of SiON and $Si_3N_4$.

5. The method of claim 4 wherein the ions implanted in the etch stop layer are selected from the group consisting of arsenic and phosphorus.

6. A method of manufacturing a semiconductor device, the method comprising:

forming a first layer of interlayer dielectric on a surface of a semiconductor substrate that contains active semiconductor devices;

forming an etch stop layer on a surface of the first layer of interlayer dielectric;

forming a second layer of interlayer dielectric on a surface of the etch stop layer;

forming a first layer of photoresist on a surface of the second layer of interlayer dielectric;

etching the first layer of photoresist down to the surface of the second layer of interlayer dielectric with an etch pattern having dimensions of a via structure to be formed in the first layer of interlayer dielectric, wherein a portion of the surface of the second layer of interlayer dielectric is exposed;

implanting ions in the exposed portion of the second layer of interlayer dielectric forming a heavily doped region in the second layer of interlayer dielectric having dimensions of the via structure to be formed in the first layer of interlayer dielectric;

removing the first layer of photoresist and forming a second layer of photoresist on the surface of the second layer of interlayer dielectric;

etching the second layer of photoresist down to the surface of the second layer of interlayer dielectric with an etch pattern having dimensions of a trench structure to be formed in the second layer of interlayer dielectric;

selectively etching the second layer of interlayer dielectric wherein a portion of the second layer of interlayer dielectric is etched and the heavily doped region in the second layer of interlayer dielectric allows the second layer of interlayer dielectric to be etched down to the surface of the etch stop layer exposing a region of the etch stop layer having dimensions of the via structure to be formed in the first layer of interlayer dielectric;

selectively etching the exposed region of the etch stop layer down to the surface of the first layer of interlayer dielectric exposing a region of the first layer of interlayer dielectric having dimensions of the via structure to be formed in the first layer of interlayer dielectric;

selectively etching the exposed region of the first layer of interlayer dielectric down to the surface of the semiconductor substrate, wherein the via structure is formed in the first layer of interlayer dielectric.

7. The method of claim 5 further comprising filling the via structure formed in the first layer of interlayer dielectric and the trench structure formed in the second layer of interlayer dielectric with a conductive material.

8. The method of claim 6 wherein the conductive material is selected from the group consisting of aluminum, tungsten and copper.

9. The method of claim 7 wherein the etch stop layer is formed from a material selected from the group consisting of SiON and $Si_3N_4$.

10. The method of claim 8 wherein the ions implanted in the second layer of interlayer dielectric from the group consisting of arsenic and phosphorus.

* * * * *